United States Patent
Derycke et al.

(10) Patent No.: US 6,924,509 B2
(45) Date of Patent: Aug. 2, 2005

(54) MONOATOMIC AND MONCRYSTALLINE LAYER OF LARGE SIZE, IN DIAMOND TYPE CARBON, AND METHOD FOR THE MANUFACTURE OF THIS LAYER

(75) Inventors: Vincent Derycke, Le Pecq (FR); Gérald Dujardin, Chatenay-Malabry (FR); Andrew Mayne, Antony (FR); Patrick Soukiassian, Remey les Chevreuse (FR)

(73) Assignees: Commissariat a l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/947,706

(22) Filed: Sep. 23, 2004

(65) Prior Publication Data

US 2005/0035380 A1 Feb. 17, 2005

Related U.S. Application Data

(63) Continuation of application No. 09/856,211, filed as application No. PCT/FR99/02979 on Dec. 1, 1999.

(30) Foreign Application Priority Data

Dec. 2, 1998 (FR) .......................................... 98 15218

(51) Int. Cl.⁷ ......................................... H01L 31/0312
(52) U.S. Cl. ............................ 257/77; 257/4; 257/627; 438/105; 117/3; 117/902; 117/929
(58) Field of Search .............................. 257/77, 4, 627; 438/105; 117/3, 4, 7, 9, 902, 929

(56) References Cited

U.S. PATENT DOCUMENTS 5,225,366 A * 7/1993 Yoder ........................... 117/90
5,420,443 A * 5/1995 Dreifus et al. ................ 257/77
5,516,500 A * 5/1996 Liu et al. ....................... 117/4
6,274,234 B1 8/2001 Dujardin et al. ............. 428/336

FOREIGN PATENT DOCUMENTS

FR  2 757 183   6/1998   ......... C30B/33/108

OTHER PUBLICATIONS

The American Physical Society, Physical Review Letters, vol. 78, No. 5, Feb. 3, 1997, "Direct Observation of a β–SiC(100)–c(4×2) Surface Reconstruction", P. Soukiassian et al.

The American Physical Society, Physical Review Letters, vol. 79, No. 19, Nov. 10, 1997, "Temperature–Induced Semiconducting c(4×2)—Metallic (2×1) Reversible Phase Transition of the β–SiC(100) Surface", V. Yu. Aristov et al.

The American Physical Society, Physical Review Letters, vol. 79, No. 13, Sep. 29, 1997, "Highly Stable Si Atomic Line Formation on the β–SiC(100) Surface", P. Soukiassian et al.

The American Institute of Physics, J. Appl. Phys. 76 (3), Aug. 1, 1994, "Promotion of the Oxidation of Silicon Carbide by a Rubidium Overlayer", M. Riehl–Chudoba et al.

(Continued)

*Primary Examiner*—Sara Crane
(74) *Attorney, Agent, or Firm*—Pearne & Gordon LLP

(57) ABSTRACT

Monoatomic and monocrystalline layer of large size, in diamond type carbon, and method for the manufacture of this layer.

According to the invention, a monocrystalline substrate (2) is formed in SiC terminated by an atomic plane of carbon according to a reconstruction c(2×2) and at least one annealing is carried out, capable of transforming this atomic plane, which is a plane of dimers C≡C (4) of sp configuration, into a plane of dimers C—C (8) of sp³ configuration. Application to microelectronics, optics, optoelectronics, micromechanics and biomaterials.

12 Claims, 1 Drawing Sheet

OTHER PUBLICATIONS

Elsevier Science B.V., Surface Science 331–333 (1995) 625–630, "Rb/β–SiC(100) Surface and Catalytic Oxidation of the Substrate", M. Riehl–Chudoba et al.

The American Physical Society, Physical Review B, vol. 51, No. 20, May 15, 1995–II, "Direct and Rb–Promoted SiOx/ β–SiC(100) Interface Formation", M. Riehl–Chudoba et al.

The American Vacuum Society, J. Vac. Sci. Technol. B 13(4), Jul/Aug 1995, Na/Carbon–Rich β–SiC(100) Surface: Initial Interface Formation and Metallization, F. Semond et al.

American Institute of Physics, Appl. Phys. Lett. 68(15) Apr. 8, 1996, "Direct SiO2/β–SiC(100)3×2 Interface Formation from 25° C. to 500° C. ", F. Semond et al.

Elsevier Science B.V., Applied Surface Science 104/105 (1996) 79–87, "Synchrotron Radiation Study of Cs/Carbon–Rich β–SiC(100) and Cs/Silicon–Rich β–SiC(100) Surfaces: Metallization and Interface Formation", F. Semond et al.

"Structure and Properties of Cubic Silicon Carbide (100) Surfaces: A Review", 1997, V. M. Bermudez, pp. 447–473.

The American Physical–Society, Physical Review B. vol. 44, No. 20, Nov. 15, 1991–II, "Structural Analysis of teh β–SiC(100)–c(2×2) Surface Reconstruction by Automated Tensor Low–Energy Electron Diffraction", J. M. Powers et al.

The American Physical Society, Physical Review Letters, vol. 76, No. 6, Feb. 5, 1996, "Structural Determination of β–SiC(100)–c(2×2) from C–1s Surface–Core–Exciton adn Si–2p Absorption", J. P. Long et al.

The American Physical Society, Physical Review Letters, vol. 77, No. 10, Sep. 2, 1996, "Atomic Structure of the β–SiC(100)–(3×2) Surface", F. Semond et al.

The American Physical Society, Physical Review B, vol. 48, No. 24, Dec. 15, 1993–II, "High–Resolution Electron–Energy–Loss Spectroscopic Study of Epitaxially Grown Diamond (111) and (100) Surfaces", Takashi Aizawa et al.

Patent Abstract of Japan, vol. 016,No. 362 (C–0971), Aug. 5, 1992, & JP 04 114995 A (Matsushita Electric Ind. Co. Ltd.), Apr. 15, 1992.

Patent Abstracts of Japan, vol. 016, No. 329 (C–0963), Jul. 17, 1992, & JP 04 092893 A (Fuain Seramitsukusu Sentaa), Mar. 25, 1992.

Kackell, P. et al.: "Polytypism and Surface Structure of SiC"; Diamond and Related Materials, vol. 6, No. 10, Aug. 1, 1997, pp. 1346–1348 XP004096938 ISSN: 0925–9635.

Kawarada H. et al.: "Heteroepitaxial Growth of Smooth and Continuous Diamond Thin Films on Silicon Substrates Via High Quality Silicon Carbide Buffer Layerse", Applied Physics Letters, Vo. 66, No. 5 Jan. 30, 1995, pp. 583–585, XP000489804 ISSN: 0003–6951.

* cited by examiner

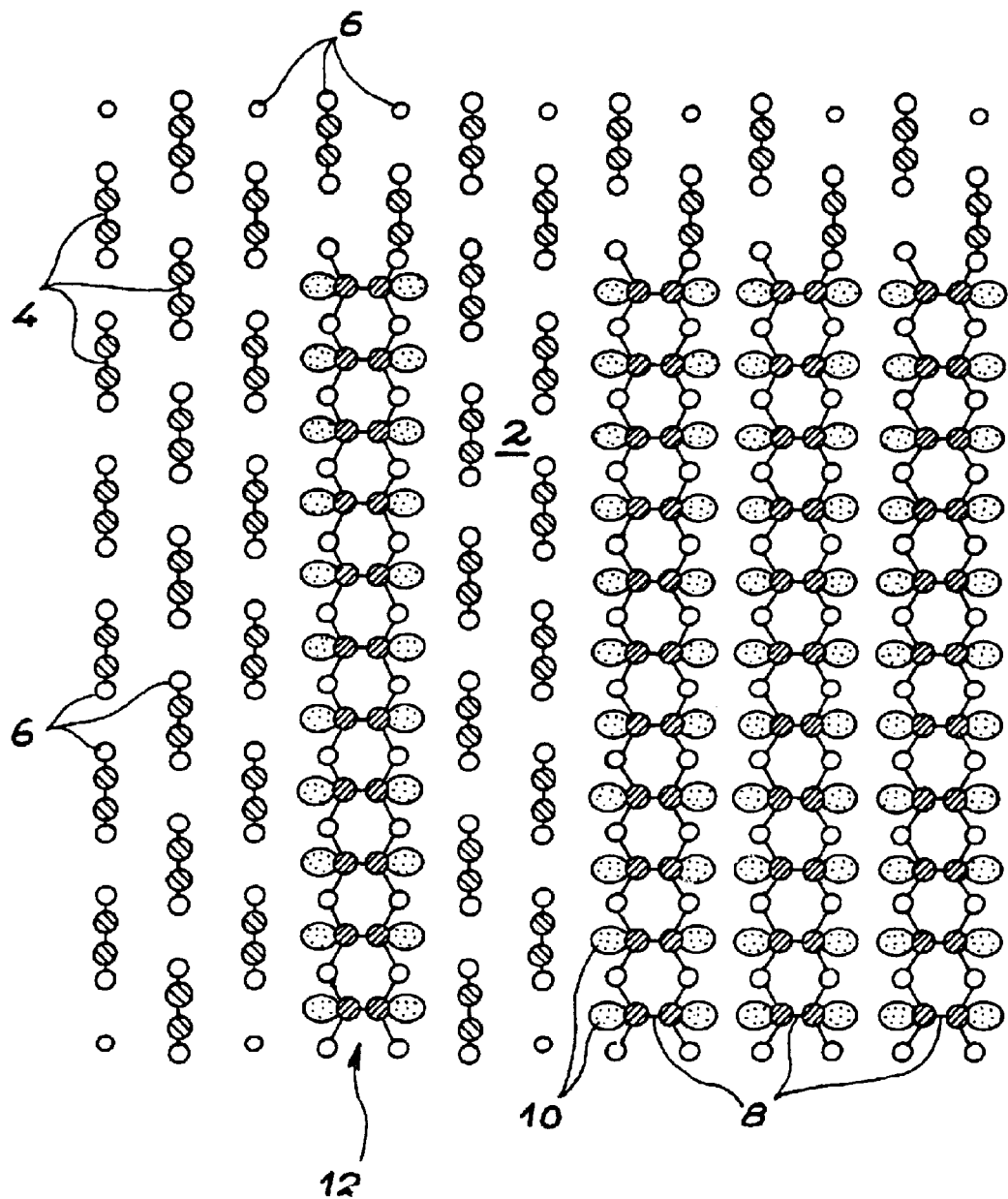

MONOATOMIC AND MONCRYSTALLINE LAYER OF LARGE SIZE, IN DIAMOND TYPE CARBON, AND METHOD FOR THE MANUFACTURE OF THIS LAYER

This application is a continuation of application Ser. No. 09/856,211, filed May 18, 2001.

TECHNICAL FIELD

The present invention relates to a monoatomic and monocrystalline layer of diamond type carbon, as well as a method for manufacturing said layer.

STATE OF THE PRIOR ART

Diamond exists in the natural state but is very rare and expensive. Furthermore, the natural diamonds available have relatively low dimensions, which limits their use in industry, their main outlet remaining jewellery.

This has led to research on methods for artificial production of diamond.

In fact, diamond is far and away the best semiconductor possible for the electronics industry. It outclasses silicon and the semiconductor compounds III–V by at least four times in terms of quality factor (in particular as far as rapid electronics, high powers and high temperatures are concerned).

It is also a biocompatible material and is very hard.

However, in order to use it, it is imperative to have available monocrystals of diamond of sufficient size, especially in the field of microelectronics.

The synthesis procedures developed so far require the intervention of extreme growth conditions: high pressures, high temperatures, plasmas, chemical deposits in vapour phase and TNT explosion techniques.

The result has been the production of crystals with low dimensions (the smallest do not exceed 4 nm) and whose assembly has not allowed crystals of greater dimensions to be obtained.

DESCRIPTION OF THE INVENTION

The aim of the present invention is to rectify the above inconveniences and, in order to do this, to suggest a structure having electronic, chemical and structural properties close to those of diamond, which will make it possible to obtain a base on which the growth of layers of diamond can take place under the same conditions: the same chemical element (carbon), the same electronic properties ($sp^3$ configuration), and the lowest possible lattice discrepancy between the substrate and the crystal of diamond.

To be precise, the present invention has the aim of a monoatomic and monocrystalline layer of carbon of the diamond type, this layer being characterised in that it is formed on the surface of a monocrystalline substrate in SiC and extends closely over the totality of this substrate.

According to a first special embodiment of the monoatomic layer and monocrystalline layer, the aim of the invention, the monocrystalline substrate in SiC is a thin layer of monocrystalline SiC is a thin monocrystalline layer of SiC in cubic phase β-SiC (100), the monoatomic and monocrystalline layer thus closely covering the totality of this platelet.

According to a second special embodiment, the monocrystalline substrate in SiC is a monocrystalline platelet of SiC in hexagonal phase, the monoatomic and monocrystalline layer thus closely covering the totality of this platelet.

Starting from the monoatomic and monocrystalline layer, the aim of the invention, one can obtain a monocrystalline layer of diamond which covers the monoatomic and monocrystalline layer and which is formed by growth from this monoatomic and monocrystalline layer, the latter acting as matrix.

The present invention also has the aim of a method of manufacture of a monoatomic and monocrystalline layer of diamond type carbon, this method being characterised in that one forms a monacrystalline substrate in SiC terminated by an atomic plane of carbon according to a reconstruction c(2×2), this plane being a plane of carbon-carbon dimers of sp configuration, and in that one carries out at least one annealing of this substrate, this annealing being capable of transforming the plane of carbon-carbon dimers of sp configuration into a plane of carbon-carbon dimers of $sp^3$ configuration thus forming a monoatomic and monocrystalline layer of diamond type carbon.

According to a first particular embodiment of operation of the method according to the invention, the monocrystalline substrate in SiC is prepared from a thin layer of monocrystalline SiC in cubic phase β-SiC with one face (100) terminated by a layer of Si.

According to a second particular embodiment, the monocrystalline substrate in SiC is prepared from a thin layer of a platelet of monocrystalline SiC in hexagonal phase having one face (1000) terminated by a layer of Si.

In order to obtain the atomic plane of carbon according to the reconstruction c(2×2), one can carry out an annealing capable of eliminating the Si layer or make a deposit of hydrocarboned molecules on the Si layer followed by a cracking of these molecules.

The hydrocarboned molecules can be chosen from the group comprising molecules of $C_2H_4$ and molecules of $C_2H_2$.

According to a special embodiment of the invention, in order to transform the plane of carbon-carbon dimers of sp configuration into a plane of carbon-carbon dimers of $sp^3$ configuration, one carries out an annealing or a plurality of successive annealings, at a temperature of about 1250° C., of the monocrystalline substrate in SiC terminated by the atomic plane of carbon according to the reconstruction c(2×2), the total length of time of annealing being greater than or about equal to 25 minutes.

The present invention makes it possible to use a substrate with properties very close to those of diamond: the same chemical element (carbon), the same type of bond ($sp^3$), the same electronic properties and even the same structure, with the only difference that the parameter of the substrate lattice is greater than that of diamond.

Nonetheless, this substrate presents the smallest lattice discrepancy possible with diamond when one compares other substrates such as silicon or certain insulators.

At the atomic level, control of the nucleation phase on a carbon terminated SiC surface according to the invention makes it possible to have a desired structural pattern identical to that of diamond.

Thus, on the atomic scale, one has a matrix making it possible to grow a thicker, monocrystalline layer of diamond.

This matrix is capable of having a large surface area in comparison with that of the platelets of silicon or silicon carbide.

It should be noted that the invention was made possible by the perfect mastery, at the atomic level, of the different compositions and reconstructions of the surfaces of β-SiC (100), in particular the surfaces of β-SiC (100) 3×2, β-SiC (100) c(4×2) and β-SiC (100) c(2×2).

Considering this subject, documents [1] to [10] can be consulted which, just like the other documents quoted below, are mentioned at the end of the present description.

Tunnel effect microscopy has confirmed the idea that the surfaces obtained were, contrary to all expectations and taking into account the state of the art, (a) of very high quality (comparable to that obtained on silicon surfaces), with a low fault density, (b) plates and (c) without corrugations.

BRIEF DESCRIPTION OF THE DRAWING

The present invention will be better understood by reading the description of examples of embodiments given below, as purely indicative and in no way limiting, referring to the unique FIGURE attached which is a diagrammatic view from above of a monoatomic and monocrystalline layer of diamond type carbon according to the invention, during formation.

DETAILED DESCRIPTION OF SPECIAL EMBODIMENTS

The production of a monoatomic and monocrystalline layer of diamond type carbon according to the invention is, for example, carried out in a sealed chamber (not shown), maintained at a pressure lower than $5 \times 10^{-9}$ Pa or under neutral atmosphere.

For example, one uses a substrate of silicon carbide constituted of a very thin monocrystalline film, of a thickness of the order of 1 μm, of silicon carbide in cubic phase β-SiC (100).

This substrate can be obtained by chemical deposit in vapour phase of a first gaseous component containing carbon and a second gaseous component containing silicon on a neighbouring surface of Si (100) oriented at 4°.

As an example, the first gaseous compound is $C_3H_8$ and the second gaseous compound is $SiH_4$.

One can also use, as a substrate, a solid monocrystal of SiC.

Consult documents [5], [6] and [7] on this subject.

From this substrate whose surface is Si terminated (that is terminated by an atomic layer of silicon), one next prepares a surface of cubic silicon carbide (β-SiC (100)) terminated by an atomic plane of carbon according to a c(2×2) reconstruction.

Consult documents [11], [12], [13] and [14] on this subject.

In order to prepare this surface, one eliminates selectively the plane of silicon by thermal annealing at a temperature of about 1200° C. for about 10 minutes.

Instead of this one can make a deposit of hydrocarboned molecules on the layer of silicon, for example a deposit of $C_2H_4$ or $C_2H_2$ molecules, and then carry out a cracking of these molecules at 950° C.

Consult documents [1] to [4], and [11] to [14] on this subject.

One thus obtains the C terminated surface, that is to say terminated by an atomic plane of carbon, and reconstructed c(2×2).

The atomic plane of carbon is a plane of carbon-carbon dimers of sp configuration: in each dimer the two atoms of carbon are linked by a triple bond C≡C.

Then, to obtain the monoatomic layer of carbon of diamond type, one transforms the plane of dimers of sp configuration into a plane of carbon-carbon dimers of $sp^3$ configuration.

In order to do this, one carries out an annealing or a plurality of successive annealings of the surface, the temperature of annealing and the total length of time of annealing being chosen to cover the surface of these dimers of $sp^3$ configuration.

As an example, one carries out a single annealing at about 1250° C. for at least 25 minutes, or several successive annealings at about 1250° C. for respective lengths of time which together total at least 25 minutes (for example, two annealings at 1250° C., the first for 15 minutes and the second for 23 minutes).

Instead of this one can heat the substrate for at least 25 minutes but at a temperature higher than 1250° C.

The single attached figure is a diagrammatic view from above of the layer of carbon of diamond type in compliance with the invention during formation on a substrate 2 in SiC.

One sees the C≡C dimers of sp type which are referenced 4 and, below these, the silicon atoms which are referenced 6.

During annealing or successive annealings there is a rupture of the triple bonds and a rearrangement of the carbon atoms to form single bonds under the form of C—C dimers of $sp^3$ type, referenced 8, these single bonds being perpendicular to the preceding triple bonds, reference 10 corresponding to the hanging bond of each C—C dimer.

Thus one obtains carbon atom chains such as chain 12 and, with sufficient annealing time or with a sequence of annealings with a sufficient total time, the number of chains of carbon atoms increases to reach a state where these carbon atoms cover the whole of the surface of the substrate 2 to form a monoatomic and monocrystalline layer of carbon of diamond type.

Thus one has a relatively simple process (thermal annealing or sequence of thermal annealings) on a commercially available material, that is cubic silicon carbide.

This material is available commercially under the form of thin layers on silicon platelets 10 cm in diameter.

The invention therefore makes it possible to grow diamond crystals with dimensions comparable to those of other semiconductors.

In the example under consideration, a face (100) of a SiC substrate was used but instead of this one could use a face (111).

Furthermore, in this example, a substrate of cubic silicon carbide was used, but the invention can also be applied to a substrate of hexagonal silicon carbide with an Si terminated face (1000).

This face has the same structure as cubic β-SiC (111).

Consult document [1] on this subject.

It should be noted that monocrystal platelets of hexagonal silicon carbide (phases 4H and 6H) of 0.5 mm thickness are commercially available, with diameters reaching three inches (about 7.5 cm).

When a monoatomic and monocrystalline layer of carbon of diamond type has been produced in accordance with the invention, it is possible to grow, on this layer, a diamond monocrystalline layer by a method known to those skilled in the art. Consult, for example, document [15] on this subject.

INDUSTRIAL APPLICATIONS

The fields of application of the present invention are extremely wide: microelectronics, optoelectronics, micromechanics and biomaterials (prostheses).

In electronics, diamond is potentially the best semiconductor possible, with exceptional properties. It is able to lead to the production of devices with performances never yet attained.

In optoelectronics, diamond is a material whose surface can operate in a negative electro-affinity regime, which is of great interest for ultra-sensitive photo-cathodes (in particular for night vision and video cameras). Furthermore, these negative electro-affinity properties can lead to the production of cathodes with microtips for emission by field effect, cathodes with which one can produce flat video screens.

Diamond is also an excellent material for use in the production of X-ray detectors.

Furthermore, in micromechanics, diamond can provide very hard coatings.

And yet again, in the field of biomaterials, diamond is the best, or at least one of the best, biocompatible materials and can be used as a basis for manufacturing prostheses or implants.

The development of microelectronics techniques with diamond requires the availability of large sized substrates in diamond, which the present invention provides.

The documents quoted in the description are the following:

[1] P. Soukiassian, F. Semond, L. Douillard, A. Mayne, G. Dujardin, l. Pizzagalli and C. Joachim, Phys. Rev. Lett. 78, 907 (1997).

[2] V. Yu Aristov, L. Douillard, O. Fauchoux and P. Soukiassian, Phys. Rev. Lett. 79, 3700 (1997).

[3] P. Soukiassian, F. Semond, A. Mayne and G. Dujardin, Phys. Rev. Lett. 79, 2498 (1997).

[4] G. Dujardin, A. Mayne, F. Semond and P. Soukiassian, French patent application N° 9615435 of Dec. 16, 1996 in the name of C.E.A. and C.N.R.S. (FR2757183A)—see also W098/27578 published Jun. 25, 1998.

[5] M. Riehl-Chudoba, P. Soukiassian and C. Jaussaud, J. Appl. Phys. 76, 1332 (1994).

[6] M. Reihl-Chudoba, S. Dupont and P. Soukiassian, Surf. Sci. 331–333, 625 (1995).

[7] M. Riehl-Chudoba, P. Soukiassian, C. Jaussaud and S. Dupont, Phys. Rev. B 51, 14300 (1995).

[8] F. Semond, P. Soukiassian, P. S. Mangat and L. di Cioccio, J. Vac. Sci. Tech. B 13, 1591 (1995).

[9] F. Semond, L. Douillard, P. Soukiassian, D. Dunham, F. Amy and S. Rivillon, Appl. Phys. Lett. 68, 2144 (1996).

[10] F. Semond, P. Soukiassian, P. S. Mangat, Z. Hurych, L. di Cioccio and C. Jaussaud, Appl. Surf. Sci. 104–105, 79 (1996).

[11] V. M. Bermudez, Phys. Stat. Sol. (b) 202, 447 (1997).

[12] J. M. Powers, A. Wander, P. J. Rous, M. A. Van Hove and G. A. Somorjai, Phys. Rev. B 44, 11159 (1991).

[13] J. P. Long, V. M. Bermudez and D. E. Ramaker, Phys. Rev. Lett. 76, 1991 (1996).

[14] F. Semond, P. Soukiassian, A. Mayne, G. Dujardin, L. Douillard and C. Jaussaud, Phys. Rev. Lett. 77, 2013 (1996).

[15] T. Aizawa, T. Ando, M. Kamo and Y. Sato, Phys. Rev. B 48, 18348 (1993).

What is claimed is:

1. Monoatomic and monocrystalline layer of diamond type carbon, said layer being characterized in that it is formed on the surface of a monocrystalline substrate of SiC and extends closely over the totality of said substrate area, said monocrystalline substrate of SiC being one of a thin layer of monocrystalline SiC in cubic phase β-SiC (100) formed on a platelet of Si or a platelet of monocrystalline SiC in hexagonal phase, said monoatomic and monocrystalline layer of diamond-type carbon consisting of a plane of carbon-carbon dimers of $sp^3$ configuration formed by transformation of the carbon hybridization on the last atomic layer of said SiC substrate, said layer of diamond-type carbon thereby extending over substantially the entire area of said substrate.

2. Monoatomic and monocrystalline layer according to claim 1, covered with a monocrystalline layer of diamond formed by growth from the monoatomic and monocrystalline layer, the latter acting as matrix.

3. Process for manufacturing a monoatomic and monocrystalline layer of diamond type carbon, comprising the steps of forming a monocrystalline substrate in SiC terminated by a carbon atomic plane according to a c(2×2) reconstruction, said plane being a plane of carbon-carbon dimers of sp configuration, and annealing said substrate to transform the plane of carbon-carbon dimers of sp configuration into said monoatomic and monocrystalline layer of diamond type carbon consisting of a plane of carbon-carbon dimers of $sp^3$ configuration.

4. Process according to claim 3, wherein said SiC monocrystalline substrate is prepared from a thin layer of monocrystalline SiC in cubic phase β-SiC with a face (100) terminated by a layer of Si.

5. Process according to claim 3, wherein said SiC monocrystalline substrate is prepared from a monocrystalline SiC platelet in hexagonal phase with a face (1000) terminated by a layer of Si.

6. Process according to claim 4, further including annealing said substrate to eliminate said layer of Si to form said atomic plane of carbon according to the reconstruction c(2×2).

7. Process according to claim 4, further including depositing hydrocarboned molecules on said Si layer and cracking said molecules to form said atomic plane of carbon according to the reconstruction c(2×2).

8. Process according to claim 7, wherein said hydrocarboned molecules are selected from the group consisting of molecules of $C_2H_4$ and molecules of $C_2H_2$.

9. Process according to claim 3, wherein said step of transforming said plane of carbon-carbon dimers of sp configuration into a plane of carbon-carbon dimers of $sp^3$ configuration, further includes an annealing or a plurality of successive annealings, at a temperature approximately equal to 1250° C., of the monocrystalline substrate in SiC terminated by the atomic plane of carbon according to the reconstruction c(2×2), the total time of annealing being greater than or about equal to 25 minutes.

10. Process according to claim 5, further including annealing said substrate to eliminate said layer of Si to obtain the atomic plane of carbon according to the reconstruction c(2×2).

11. Process according to claim 5, further including depositing hydrocarboned molecules on said layer of Si and cracking said molecules to obtain the atomic plane of carbon according to the reconstruction c(2×2).

12. Process according to claim 11, said hydrocarboned molecules are selected from the group consisting of molecules of $C_2H_4$ and molecules of $C_2H_2$.

* * * * *